(12) United States Patent
Hung et al.

(10) Patent No.: US 10,879,131 B2
(45) Date of Patent: Dec. 29, 2020

(54) SEMICONDUCTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Tsungyu Hung, Hsinchu (TW); Pei-Wei Lee, Pingtung County (TW); Pang-Yen Tsai, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/263,573

(22) Filed: Jan. 31, 2019

(65) Prior Publication Data

US 2020/0043806 A1 Feb. 6, 2020

Related U.S. Application Data

(60) Provisional application No. 62/712,554, filed on Jul. 31, 2018.

(51) Int. Cl.
*H01L 21/82* (2006.01)
*H01L 21/8238* (2006.01)
*H01L 27/092* (2006.01)
*H01L 29/16* (2006.01)
*H01L 21/02* (2006.01)
*H01L 29/78* (2006.01)

(52) U.S. Cl.
CPC ........ *H01L 21/823821* (2013.01); *H01L 21/02205* (2013.01); *H01L 21/823878* (2013.01); *H01L 21/823892* (2013.01); *H01L 27/0924* (2013.01); *H01L 29/16* (2013.01); *H01L 29/7851* (2013.01)

(58) Field of Classification Search
CPC ........ H01L 21/823821; H01L 29/7851; H01L 21/02205; H01L 21/823892; H01L 27/0924; H01L 21/823878; H01L 29/16
USPC ............................................. 257/368
See application file for complete search history.

(56) References Cited

U.S. PATENT DOCUMENTS

| | | | |
|---|---|---|---|
| 8,294,180 B2* | 10/2012 | Doyle | H01L 21/823807 257/192 |
| 8,415,209 B2* | 4/2013 | Rooyackers | B82Y 10/00 438/149 |
| 9,865,730 B1* | 1/2018 | Jagannathan | H01L 29/66666 |
| 2012/0319211 A1* | 12/2012 | van Dal | H01L 29/66795 257/401 |

* cited by examiner

*Primary Examiner* — Vu A Vu
(74) *Attorney, Agent, or Firm* — WPAT, P.C., Intellectual Property Attorneys; Anthony King

(57) ABSTRACT

The present disclosure provides a method for method for forming a semiconductor structure, including providing a substrate with a first well region of a first conductivity type, forming a silicon layer over the first well region, forming a first silicon fin over the first well region, and applying a silicon-free gas source upon the first silicon fin.

19 Claims, 8 Drawing Sheets

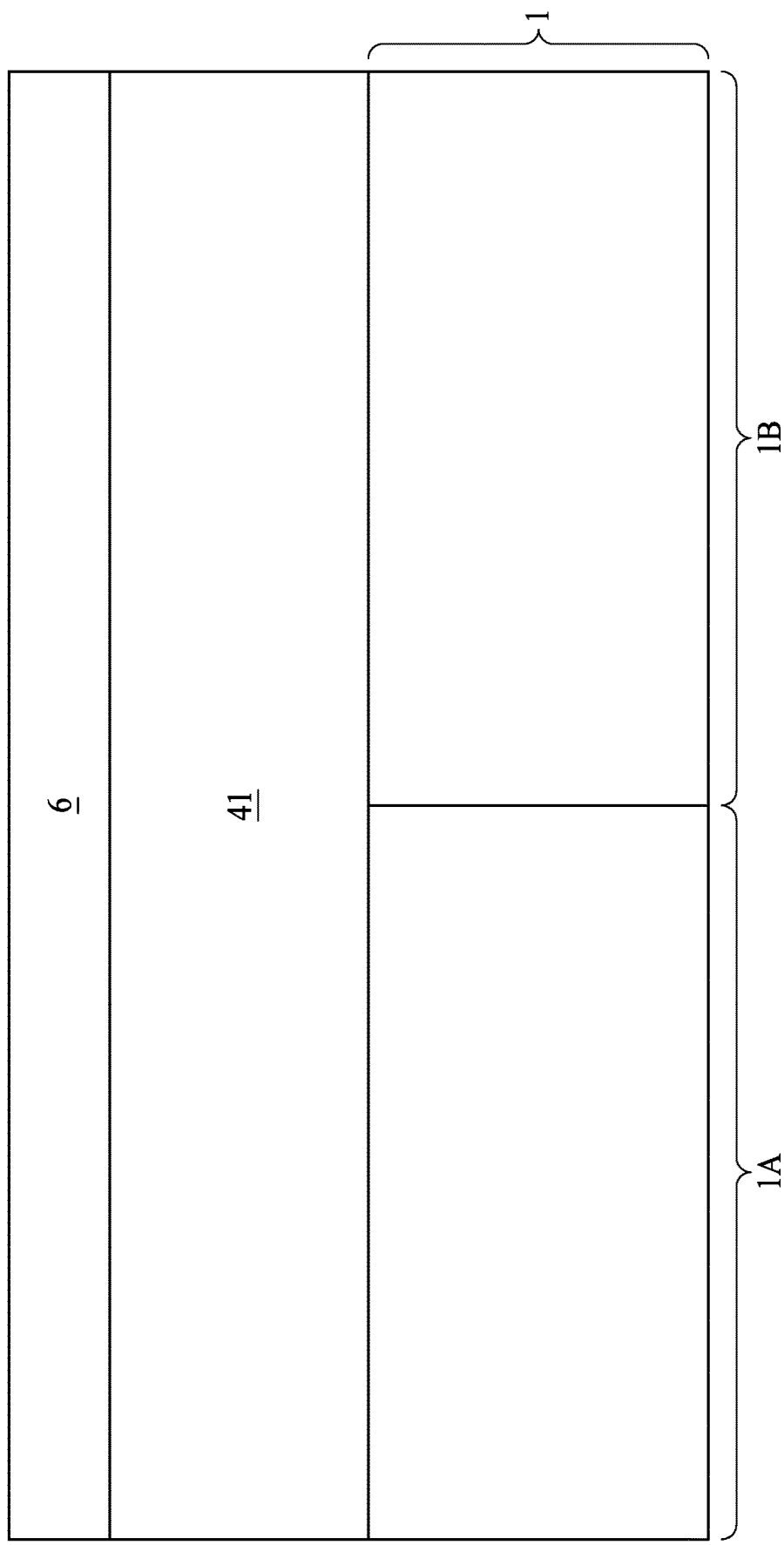

SEMICONDUCTOR STRUCTURE AND MANUFACTURING METHOD FOR THE SAME

CROSS REFERENCE TO RELATED APPLICATIONS

This application claims the benefit of prior-filed provisional application No. 62/712,554, filed Jul. 31, 2018.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency.

However such scaling down process has also increased the complexity of processing and fabricating ICs. For these advances to be realized, improvements in IC processing and manufacturing are entailed. For example, a three dimensional transistor, such as a fin field-effect transistor (FinFET), has been introduced.

Silicon germanium (SiGe) is one of the materials applied herein to enhance the performance of the FinFET, such as electron mobility and hole mobility can be improved. Therefore, the improvement on SiGe formation is entailed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 to FIG. 7 are cross sections of a semiconductor structure during intermediate stages of manufacturing operations, in accordance with some embodiments of the present disclosure.

DETAILED DESCRIPTION

Figure 1:
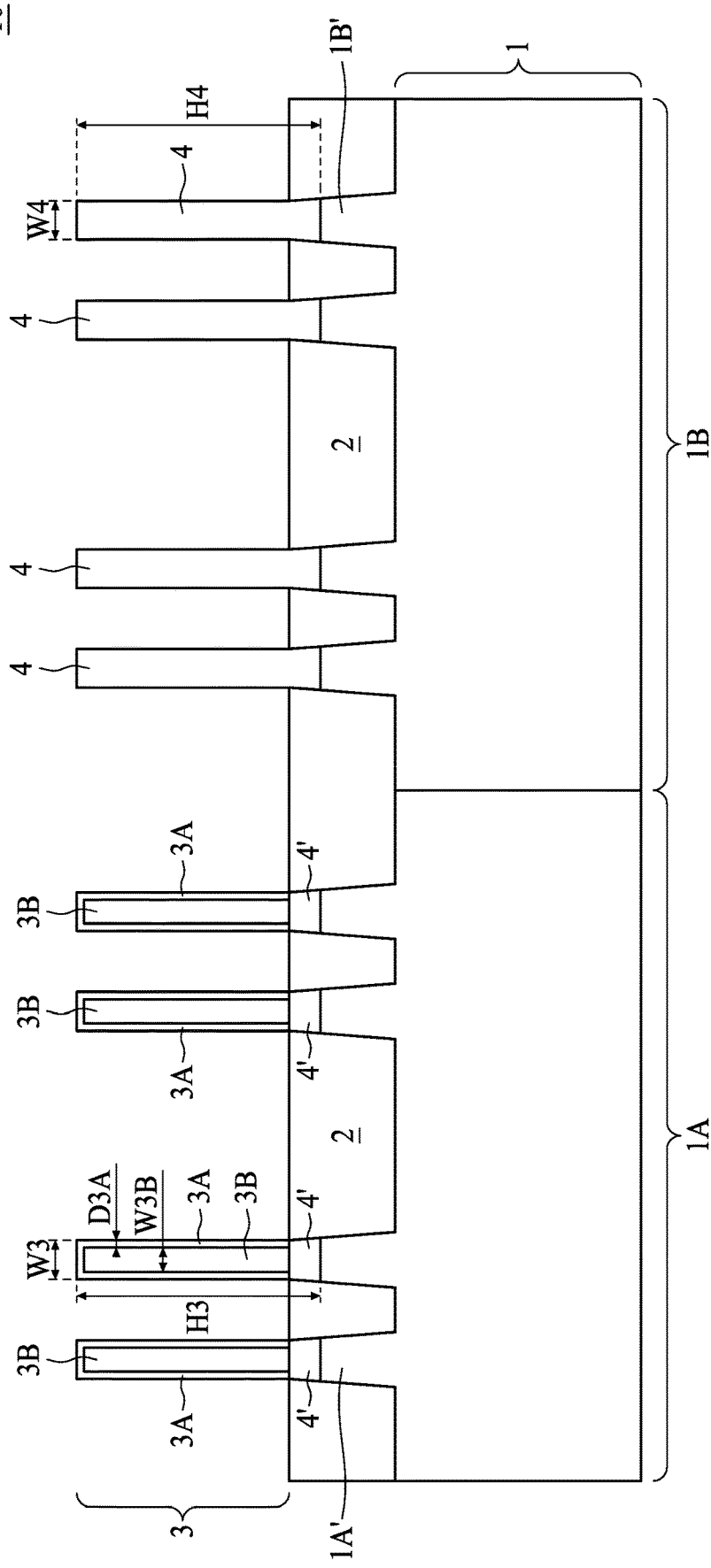
FIG. 1 is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Conventionally, a silicon germanium fin may be fabricated by patterning or etching a silicon germanium layer above a given substrate, which entails complex procedures, induces higher cost, or causing certain degree of shifting. For example, a silicon layer is epitaxially grown over a first conductive type region and a second conductive type region over a substrate. A portion of the silicon layer over the first conductive type region is then removed or a recess being formed in said portion of the silicon layer. Subsequently, a silicon germanium layer is epitaxially formed over the first conductive type region or in the recess. A chemical mechanical polishing (CMP) operation may be performed after the deposition of silicon germanium layer. Normally, the germanium content in the epitaxially grown silicon germanium layer is lower than 25 atomic percent (at. %), thereby preventing a greater germanium content in the subsequently-patterned silicon germanium fins.

Another conventional fabrication method may include depositing a high germanium content (usually over 50 at. % germanium) silicon germanium layer conforming to a top and sidewall surfaces of a silicon fin in a first conductive type region, and performing a germanium drive-in by a high temperature annealing. The high germanium content (usually over 50 at. % germanium) silicon germanium layer may possess a thickness of about 2-3 nm. Depending on the thermal profile of the annealing operation, the silicon fin in the first conductive region can either turns out to be a uniform silicon germanium fin or a fin with a silicon center and a silicon germanium periphery. For example, a surface germanium content after annealing can be in a range of from about 5 at. % to 30 at. %, and a center germanium content can be zero. In the advanced technology node where a fin width is narrower than 10 nm, the aforesaid high temperature annealing may deform the fin. In addition, the width of the fin may be increased due to the silicon germanium layer deposited thereon, thus limiting the realization of miniaturization.

The present disclosure provides a method of forming a silicon germanium fin that requires neither silicon germanium layer epitaxy (with germanium content lower than 35 at. %) followed by fin patterning nor high thermal annealing to drive-in silicon germanium film (with germanium content greater than 50 at. %) at fin surface.

Referring to FIG. 1, FIG. 1 a cross section of a semiconductor structure 10, in accordance with some embodiments of the present disclosure. The semiconductor structure 10 includes a portion of a substrate 1 having a first well region 1A and a second well region 1B, an isolation region 2, a first fin 3, a second fin 4. Herein a first conductivity of the first well region 1A and a second conductivity of the second well region 1B may be different, for example, the first conductivity is n-type and the second conductivity is p-type, accordingly the first well region 1A is an N-well region and the second well region 1B is a P-well region.

The isolation region 2 is disposed above the first well region 1A and the second well region 1B. In some embodiments, the isolation region 2 is a shallow trench isolation (STI), which may include silicon oxide, silicon nitride, nitride, silicide, or the like. A material of the second fin 4 may be silicon. At least one second fin 4 is disposed over the second well region 1B and protrudes from the isolation region 2, wherein a bottom surface of the second fin 4 may be below a top surface of the isolation region 2. The second fin 4 has a width W4 and a height 114, for exemplary demonstration, the width W4 may be in a range from about 5 nanometer to about 8 nanometer, and the height 114 can be around 57 nanometer, but the present disclosure is not limited thereto.

At least one first fin 3 is disposed over the first well region 1A and protrudes from the isolation region 2. The first fin 3 may include a center region 3B and a peripheral region 3A surrounding the center region 3B. The electron mobility and the hole mobility of the semiconductor structure 10 is positively related to an atomic concentration of germanium at the surface of the first fin 3. The electron mobility as well as the hole mobility of the semiconductor structure 10 may increase when the atomic concentration of germanium at the surface of the first fin 3 increases. Thence, the peripheral region 3A of the first fin 3 may include silicon germanium, herein the composition of silicon germanium can be expressed as $Si_{1-X}Ge_X$, as the X is the atomic percentage of germanium composition. The center region 3B includes silicon and may be free of germanium.

The first fin 3 has a width W3, which may be greater than the width W4, for example, the width W4 is in a range from 4 nanometer to 10 nanometer. The center region 3B has a width W3B within a range from about 50% of the width W3 to about 90% of the width W3, as the peripheral region 3A has a depth D3A measured from the surface of the first fin 3 toward a center of the first fin 3, the depth D3A is in a range from about 5% of the width W3 to about 25% of the width W3.

An atomic concentration profile of germanium within the peripheral region 3A may be gradient, that is, gradually decreasing from the surface of the first fin 3 toward the center of the first fin 3. An atomic concentration X of germanium at the surface of the first fin 3 may be within 20% to 35%, which may improve electron mobility as well as the hole mobility of the semiconductor structure 10. Alternatively stated, an atomic concentration of silicon within the peripheral region 3A may also be gradient, gradually increasing from the surface of the first fin 3 toward the center of the first fin 3.

The first well region 1A may further include an extension part 1A' spacing between the first fin 3 and the substrate 1, wherein a surface of the extension part 1A' is aligned with and/or coplanar with a surface of the first fin 3. The second well region 1B may further include an extension part 1B' spacing between the second fin 4 and the substrate 1, wherein a surface of the extension part 1B' is aligned with and/or coplanar with a lateral surface of the second fin 4. In some embodiments, the semiconductor structure 10 may further include a silicon portion 4' spacing between the first fin 3 and the extension part 1A'. A height H3 measured from a top surface of the first fin 3 to a bottom surface of the silicon portion 4' is similar to the aforesaid height 114 of the second fin 4. The isolation region 2 partially surrounding the second fin 4 and has a top surface above the extension part 1A', thus providing sufficient depth to improve the prevention of current leakage.

Figure 2A:
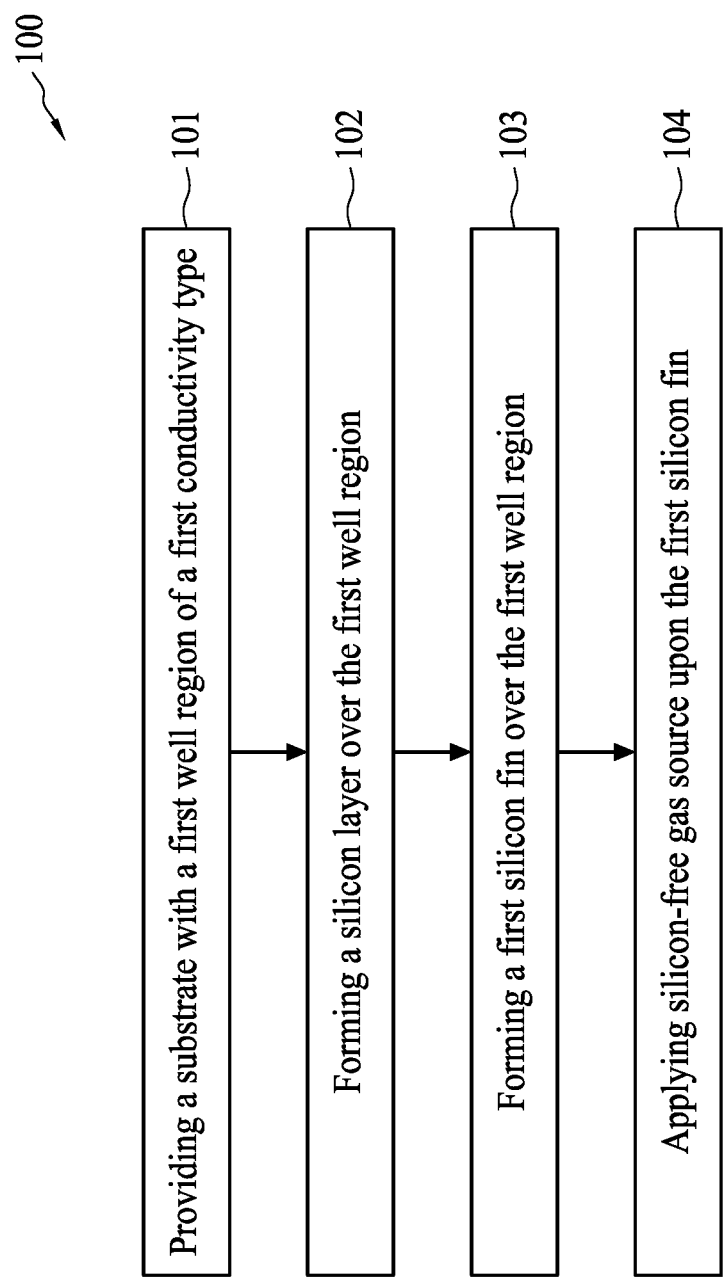
FIG. 2A shows a flow chart representing method for fabricating a semiconductor structure, in accordance with some embodiments of the present disclosure.

Referring to FIG. 2A, FIG. 2A shows a flow chart 100 representing method for fabricating the semiconductor structure 10, in accordance with some embodiments of the present disclosure. The method for fabricating the semiconductor structure 10 includes providing a substrate with a first well region of a first conductivity type (operation 101), forming a silicon layer over the first well region (operation 102), forming a first silicon fin over the first well region (operation 103), and applying a silicon-free gas source upon the first silicon fin (operation 104).

Figure 2B:
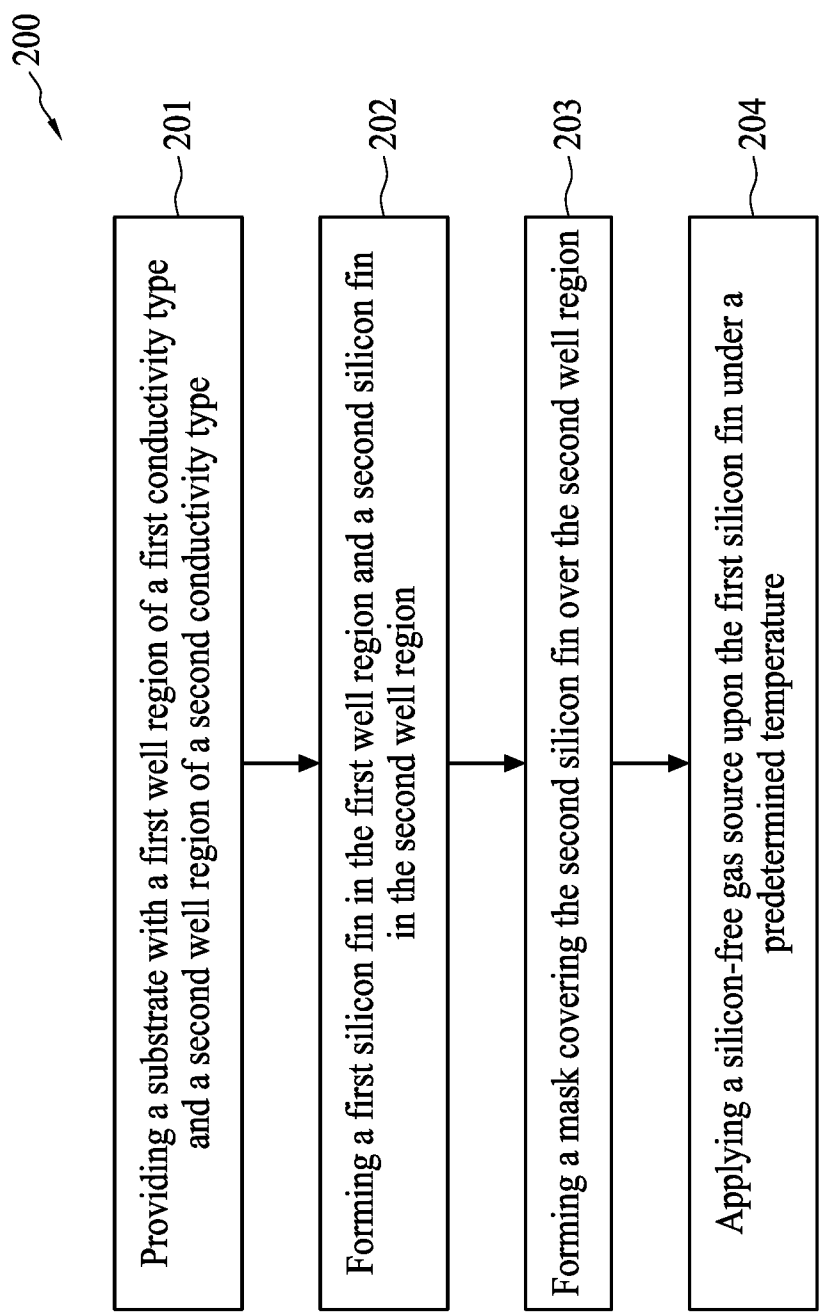
FIG. 2B shows a flow chart representing method for fabricating a semiconductor structure, in accordance with some embodiments of the present disclosure.

Referring to FIG. 2B, FIG. 2B shows a flow chart 200 representing method for fabricating the semiconductor structure 10, in accordance with some embodiments of the present disclosure. The method for fabricating the semiconductor structure 10 includes providing a substrate with a first well region of a first conductivity type and a second well region of a second conductivity type (operation 201), forming a first silicon fin in the first well region and a second silicon fin in the second well region (operation 202), forming a mask covering the second silicon fin over the second well region (operation 203), and applying a silicon-free gas source upon the first silicon fin under a predetermined temperature (operation 204).

Referring to FIG. 3, FIG. 3 is a cross section of the semiconductor structure 10 during an intermediate stage of manufacturing operations, in accordance with some embodiments of the present disclosure. The first well region 1A and the second well region 1B are formed within the substrate 1. The first well region 1A is doped with a first dopant having the first conductivity, and the second well region 1B is doped with a second dopant having the second conductivity. For example, the first dopant can be an n-type dopant, such as phosphorus (P), arsenic (As), antimony (Sb), or the like. The second dopant can be a p-type dopant, such as boron (B), indium (In), or the like. Subsequently, a silicon layer 41 is formed above the first well region 1A and the second well region 1B. In some embodiments, the silicon layer 41 is undergone an anti-punch through implantation. Such anti-punch through implantation may improve the prevention of source/drain punch through. A mask 6 is subsequently formed above the silicon layer 41 for patterning, which may include operations such as photolithography, wet etching, dry etching, and/or the like. In some embodiments, the mask 6 can be an oxide layer.

Figure 4:
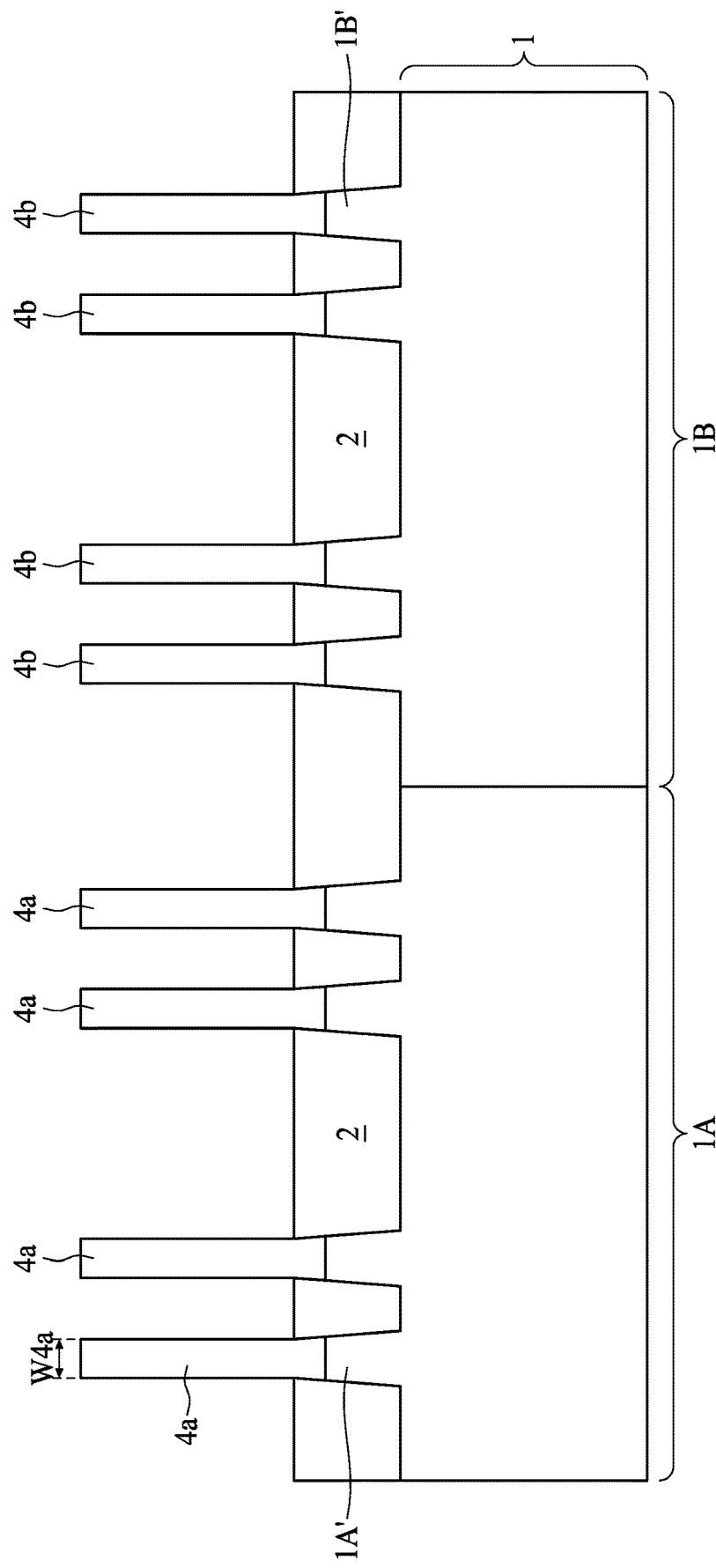

Referring to FIG. 4, FIG. 4 is a cross section of the semiconductor structure 10 during an intermediate stage of manufacturing operations, in accordance with some embodiments of the present disclosure. The mask 6 is removed subsequent to patterning, and thereby a first silicon fin 4a having a width W4a is formed over the first well region 1A and a second silicon fin 4b is formed over the second well region 1B. In some embodiments, the width W4a is substantially identical to the width W4 previously discussed in FIG. 1, for example, in a range from 7 nanometer to 10 nanometer.

The isolation region 2 is formed over the first well region 1A and the second well region 1B, wherein the isolation region 2 partially surrounds a bottom portion of the first silicon fin 4a and the second silicon fin 4b. The isolation region 2 can be formed by utilizing shallow trench isolation (STI) technology, which may include recessing, local oxidation, photolithography operation, deposition, or the like, but the present disclosure is not limited thereto. In some embodiments, a portion of the substrate 1 is removed from the surface during the operation of forming the isolation region 2, thereby the extension part 1A' of the first well region 1A is formed between the first silicon fin 4a and the substrate 1, as the extension part 1B' of the second well region 1B are formed between the second silicon fin 4b and the substrate 1. Each of the extension part 1A' and the extension part 1B' is aligned with and/or coplanar with a lateral surface of the first silicon fin 4a and a lateral surface of the second fin 4 respectively.

Figure 5:
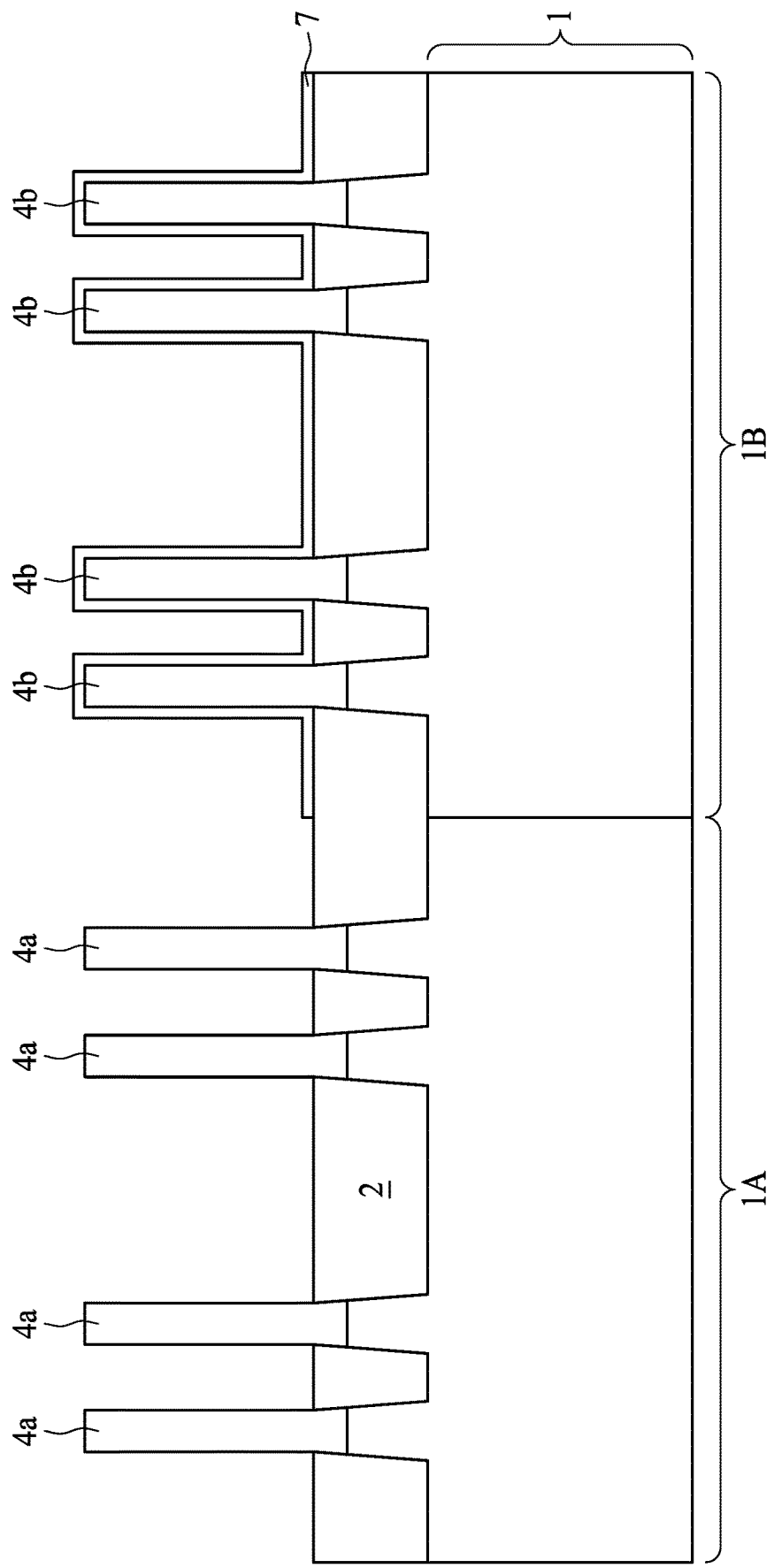

Referring to FIG. 5, FIG. 5 is a cross section of the semiconductor structure 10 during an intermediate stage of manufacturing operations, in accordance with some embodiments of the present disclosure. A mask 7 covers a surface of the second silicon fin 4b and a top surface of the second well region 1B. Herein a top surface of the first well region 1A and the first silicon fin 4a over the first well region 1A are exposed from the mask 7. In some embodiments, A material of the mask 7 may be amorphous or polycrystalline, such as silicon nitride (SiN), nitride, or the like. During the germanium drive in operation, which will be subsequently discussed in FIG. 6, the second silicon fin 4b over the second well region 1B is prevented from being contact with the silicon-free gas source 8. Alternatively stated, the mask 7 may provide protection to prevent germanium from driving-in operation the second silicon fin 4b over the second well region 1B. The properties of the mask 7 will also be discussed in FIG. 6 subsequently.

Figure 6:
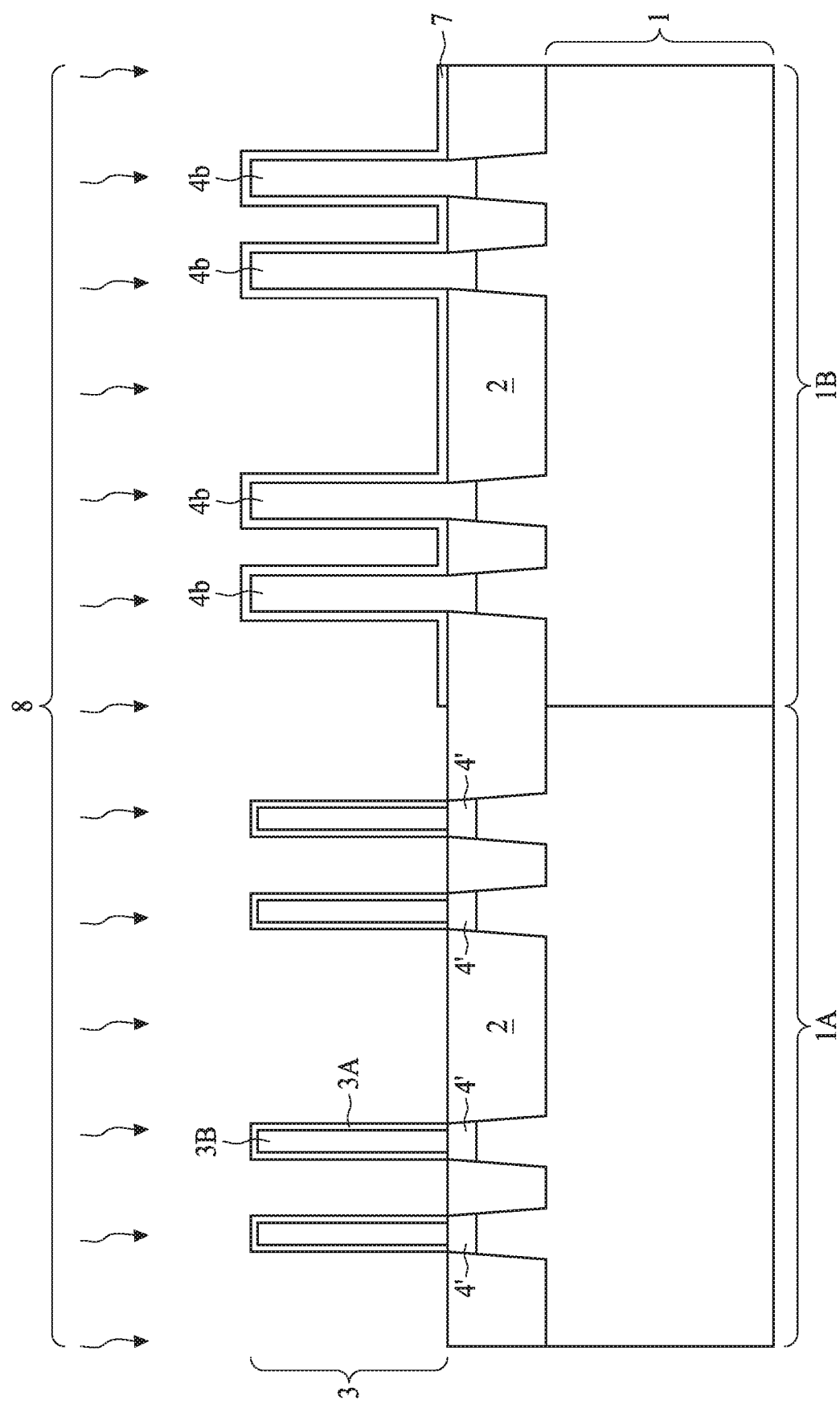

Referring to FIG. 6, FIG. 6 is a cross section of the semiconductor structure 10 during an intermediate stage of manufacturing operations, in accordance with some embodiments of the present disclosure. A gas source 8 is subsequently applied upon the first well region 1A and the second well region 1B. The gas source 8 may include germanium-containing material, such as germanium tetrahydride ($GeH_4$), digermane ($Ge_2H_6$), trigermane ($Ge_3H_8$), the combination thereof, or other gaseous compounds including germanium. In some embodiments, the gas source 8 is free of silicon-containing material such as silicon precursors including TEOS and TDMAS. By applying the gas source 8 upon the first silicon fin 4a over the first well region 1A, germanium in the gas source 8 may be in-situ drove to a surface of the first silicon fin 4a, thereby the first fin 3 (shown in FIG. 1) is formed. Germanium is directly drove into the surface of the first silicon fin 4A, and forming silicon germanium ($Si_{1-X}Ge_X$) layer with a gradient atomic concentration profile of germanium within the peripheral region 3A (shown in FIG. 1). As previously discussed, the peripheral region 3A has the depth D3A (shown in FIG. 1) measured from the surface of the first fin 3 toward a center 3B of the first fin 3, the depth D3A is in a range from about 5% of the width W3 (shown in FIG. 1) to about 25% of the width W3. As for the atomic concentration profile of germanium within the peripheral region 3A, gradually decreasing from the surface of the first fin 3 toward the center 3B of the first fin 3. An atomic concentration X of germanium at the surface of the first fin 3 may be within 20% to 35%.

It is noteworthy that the gas source 8 may be a silicon-free gas. If the gas source 8 includes silicon, during the operation of fabricating the first silicon fin 4a over the first well region 1A into the first fin 3, a silicon germanium layer may be deposited on the surface of the first silicon fin 4a instead of germanium being directly drove into the surface of the first fin 3.

In some embodiments, the gas source 8 can include germanium etchant such as chloride-containing gas. In some embodiments, the gas source 8 includes hydrogen chloride (HCl) that timely removes the initial deposition of the germanium on the mask 7 over the second well region 1B. In some embodiments, when the hard mask 7 is composed of silicon nitride having an amorphous surface, such amorphous surface can still accumulate finite amount of germanium materials condensed from the gas source 8. Application of germanium etchant can timely remove the germanium materials and achieve a selective result. In some embodiments, the flow rate of germanium etchant (e.g., HCl) and germanium precursor gas (e.g., $GeH_4$) can be selected to be in a proper ratio range in order to achieve such selective result.

In some embodiments, the gas source 8 may further include carrier gas, such as hydrogen ($H_2$), nitrogen ($N_2$), helium, (He), argon (Ar), inert gas, or other suitable gas which has a higher linear flow velocity as well as a significantly weak intermolecular interaction with the aforesaid germanium-containing gas. The germanium-containing gas may be stably applied on the first well region 1A and the second well region 1B with the aid of carrier gas. The carrier gas may also provide stable flow rate which can be controlled and monitored relatively easier.

The operation of applying the gas source 8 upon the first silicon fin 4a over the first well region 1A and the mask 7 over the second well region 1B is under a predetermined temperature range and a predetermined pressure range. In some embodiments, the predetermined temperature range is within a range from about 700° C. to about 1000° C. If the aforesaid operation is performed under a temperature lower than 700° C., germanium may be deposited on the surface of the first silicon fin 4a over the first well region 1A instead of being driven into the surface thereof. If the aforesaid operation is performed under a temperature higher than 1000° C., the first silicon fin 4a, the second silicon fin 4b, and/or adjacent features may be affected by excessively high temperature, such as deformation or anomalies of the fin can be induced. Under a temperature within a range from about 700° C. to about 1000° C., amount of germanium deposited on the surface of the first silicon fin 4a is negligible due to the phenomena that germanium has weak tendency to be formed onto a silicon surface under 700° C. to about 1000° C. In some embodiments, the predetermined pressure is in a range from about 0.1 torr to about 600 torr. The performance of driving germanium into the surface of the first silicon fin 4a may be deteriorated if the predetermined pressure is lower than 0.1 torr or higher than 600 torr. The aforesaid condition including the supplying the gas source 8, the predetermined temperature within a range from about 700° C. to about 1000° C., and the predetermined pressure in a range from about 0.1 torr to about 600 torr, can be provided by various semiconductor fabrication tools including furnace, chemical vapor deposition system, chemical vapor deposition furnace, deposition apparatus, or the like.

In some embodiments, a mass flow rate of the germanium-containing gas can be adjusted during the germanium drive in operation. For example, supply $GeH_4$ with a mass flow rate of 300 sccm (standard cubic centimeters per minute) for 10 seconds under 800° C., and subsequently supply $GeH_4$ with a mass flow rate of 100 sccm. Changing the mass flow rate of the germanium-containing gas may control the germanium drive in operation more precisely.

In some embodiments, since a bottom portion of the first silicon fin 4a is surrounded by the isolation region 2, as a top surface of the isolation region 2 is above a bottom surface of the first silicon fin 4a, the bottom portion of the first silicon fin 4a may not be applied by the gas source 8. Therefore subsequent to the germanium drive in operation, the silicon portion 4' is remained between the first fin 3 and the first well region 1A.

During the operation of driving in germanium into the surface of the first silicon fin 4a within the first well region 1A, germanium may also be driven in the surface of the second silicon fin 4b within the second well region 1B, therefore the mask 7 is formed prior to the germanium drive in operation to alleviate thereof. The material of the mask 7 may be amorphous or polycrystalline, such as silicon nitride (SiN), nitride, or the like, which may effectively provide prevention for the surface of the second silicon fin 4b within the second well region 1B being drove in by germanium. Although the germanium drive in operation may be enhanced under the conditions including the predetermined temperature within a range from about 700° C. to about 1000° C. and the predetermined pressure in a range from about 0.1 torr to about 600 torr, however under such condition, germanium may have a tendency to be formed on a surface of the mask 7. Such germanium growth may further affect the removal operation of the mask 7 subsequent to the germanium drive in operation.

In some embodiments, the gas source 8 may further include a selective etch gas in order to perform an in situ removal operation of the germanium layer grown on the surface of the mask 7. The selective etch gas provided in the in situ removal process may be a chlorine-containing gas, such as hydrogen chloride gas (HCl). But a material of the selective etch gas is not limited thereto, as other suitable gas that can effectively remove germanium formed on the surface of the mask 7 are under consideration.

The ratio of the selective etch gas and the germanium-containing gas, such as germanium tetrahydride ($GeH_4$), digermane ($Ge_2H_6$), trigermane ($Ge_3H_8$), in the gas source 8 is decided by the formation rate of germanium on the surface of the mask 7 and the rate of germanium driving in the surface of the first silicon fin 4a within the first well region 1A. Increasing the ratio of selective etch gas in the gas source 8 may increase the rate of removing germanium on the surface of the mask 7, however, the germanium drive in process may take longer process time to achieve the atomic concentration profile of germanium within the peripheral region 3A previously discussed in FIG. 1 since a concentration of the germanium-containing gas is decreased. Reversely, increasing the ratio of the germanium-containing gas in the gas source 8 may speed up the efficiency to achieve the atomic concentration profile of germanium within the peripheral region 3A, but the removing rate of the germanium on the surface of the mask 7 may be too low, thus the germanium may remain on the surface of the mask 7 when the germanium drive in operation is complete. Therefore the ratio of the selective etch gas and the germanium-containing gas in the gas source 8 may be controlled in a range where germanium is effectively removed from the surface of the mask 7 while sustaining the efficiency of the germanium drive in operation.

Figure 7:
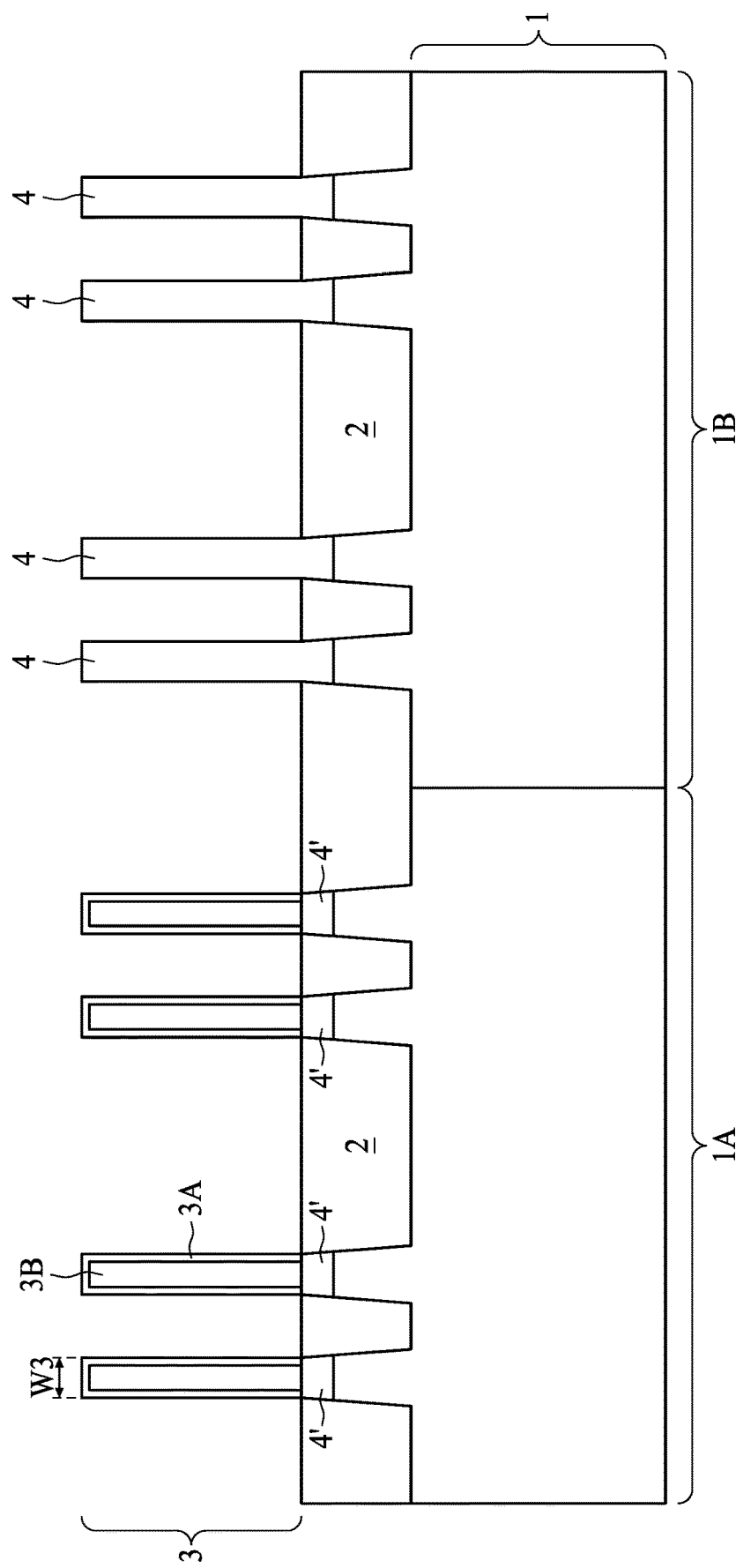

Referring to FIG. 7, FIG. 7 is a cross section of the semiconductor structure 10 during an intermediate stage of manufacturing operations, in accordance with some embodiments of the present disclosure. The mask 7 is subsequently removed from the surface of the second silicon fin 4b over the second well region 1B. Thereby the second fin 4 is formed in the second well region 1B. In some embodiments, the width W3 of the first fin 3 is substantially identical to the width W4a of the first silicon fin 4a (shown in FIG. 4) since the germanium drive in operation is similar to a surface treatment operation, instead of depositing an additional layer onto the surface of the first silicon fin 4a. In contrast to conventional art, present disclosure is free of any extra annealing operation which is performed to diffuse the germanium in the high germanium content silicon germanium into the center of the silicon fin.

In some embodiments, the first fin 3 formed over the first well region 1A may be used as a p-type metal-oxide-semiconductor field effect transistor (PMOS), as the second fin 4 formed over the second well region 1B may be used as an n-type metal-oxide-semiconductor field effect transistor (NMOS).

Some embodiments of the present disclosure provide a semiconductor structure 10 and fabrication methods thereof to enhance the performance of the semiconductor structure 10. By performing a germanium drive in operation on the first silicon fin 4a over the first well region 1A, the first silicon fin 4a is thereby formed into the first fin 3 having a peripheral region 3A, wherein an atomic concentration profile of germanium within the peripheral region 3A may be gradually decreasing from the surface of the first fin 3 toward the center of the first fin 3. The atomic concentration of germanium at the surface of the first fin 3 may be within 20% to 35%, which may improve electron mobility as well as the hole mobility of the semiconductor structure 10. In addition, the width increase of the first fin 3 compare to the first silicon fin 4a may be negligible by virtue of the surficial treatment of the germanium drive in operation.

The features of semiconductor structure 10 previously introduced in FIG. 1 and the fabrication methods thereof can be applied in metal gate process, double-gate transistor process, multi-gate device process, 3D FinFET process, planar FinFET process, gate-all-around process, field-effect transistors process, memory device manufacturing, microprocessor manufacturing, transistor fabrication, display drivers manufacturing, planar transistors manufacturing, processing unit manufacturing, integrated circuit manufacturing, optical device manufacturing, or the like.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a method for forming a semiconductor structure, including providing a substrate with a first well region of a first conductivity type, forming a silicon layer over the first well region, forming a first silicon fin over the first well region, and applying a silicon-free gas source upon the first silicon fin.

Some embodiments of the present disclosure provide a method for forming a semiconductor structure, including providing a substrate with a first well region of a first conductivity type and a second well region of a second conductivity type, forming a first silicon fin in the first well region, forming a second silicon fin in the second well region, forming a mask covering the second silicon fin over the second well region, and applying a silicon-free gas source upon the first silicon fin under a predetermined temperature.

Some embodiments of the present disclosure provide a semiconductor structure, including a substrate having a first well region of a first conductivity type and a second well region of a second conductivity type, a first fin over the first well region, wherein the first fin comprises an atomic concentration of germanium gradually decreasing from a surface toward a center of the first fin, the center of the first fin being free of germanium, and a second fin over the second well region, wherein the second fin comprises silicon.

What is claimed is:

1. A method for forming a semiconductor structure, comprising:
   providing a substrate with a first well region of a first conductivity type and a second well region of a second conductivity type;
   forming a silicon layer over the first well region;
   forming a first silicon fin over the first well region;
   forming a second silicon fin over the second well region;
   applying a silicon-free gas source upon the first silicon fin; and
   forming a mask covering the second silicon fin prior to the applying the silicon-free gas source upon the first silicon fin.

2. The method of claim 1, wherein the mask comprises nitride.

3. The method of claim 1, further comprising removing the mask from the second well region.

4. The method of claim 1, further comprising applying a chlorine-containing gas concurrently with the silicon-free gas.

5. The method of claim 1, wherein the silicon-free gas source comprises germanium-containing material.

6. The method of claim 5, wherein the germanium-containing material comprises $GeH_4$ and $Ge_2H_6$.

7. The method of claim 1, further comprising applying hydrogen or nitrogen gas.

8. The method of claim 1, wherein applying the silicon-free gas source is under a temperature in a range from about 700 degrees Celsius to 1,000 degrees Celsius.

9. A method for forming a semiconductor structure, comprising:
   providing a substrate with a first well region of a first conductivity type and a second well region of a second conductivity type;
   forming a first silicon fin in the first well region;
   forming a second silicon fin in the second well region;
   forming a mask covering the second silicon fin over the second well region; and
   applying a silicon-free gas source upon an exposed sidewall of the first silicon fin, wherein the silicon-free gas source comprises germanium-containing material.

10. The method of claim 9, wherein the mask comprises amorphous material.

11. The method of claim 9, further comprising applying the silicon-free gas source upon the second silicon fin.

12. The method of claim 9, further comprising applying a chlorine-containing gas upon the first silicon fin and the mask.

13. The method of claim 9, wherein the silicon-free gas is applied under a predetermined temperature, the predetermined temperature is in a range from about 700 degrees Celsius to 1,000 degrees Celsius.

14. The method of claim 9, further comprising removing the mask from the second well region after applying the silicon-free gas source.

15. A method for forming a semiconductor structure, comprising:
- providing a substrate with a first well region of a first conductivity type and a second well region of a second conductivity type;
- forming a first silicon fin over the first well region;
- diffusing germanium into a surface of the first silicon fin, comprising:
  - applying a silicon-free gas upon the first silicon fin under a temperature above 700° C. so that the first fin comprises an atomic concentration of germanium gradually decreasing from the surface toward a center of the first fin, wherein the center of the first fin is free of germanium.

16. The method of claim 15, wherein the center occupies at least 50% of a width of the first fin.

17. The method of claim 15, wherein the center occupies about 90% of the width of the first fin.

18. The method of claim 15, further comprising applying a chlorine-containing gas upon the first silicon fin.

19. The method of claim 15, further comprising
- forming a second silicon fin over the second well region; and
- forming a mask over the second silicon fin prior to diffusing germanium into the surface of the first silicon fin.

* * * * *